US012622016B2

(12) United States Patent
Qiao et al.

(10) Patent No.: US 12,622,016 B2
(45) Date of Patent: May 5, 2026

(54) LATERAL POWER SEMICONDUCTOR DEVICE

(71) Applicant: University of Electronic Science and Technology of China, Chengdu (CN)

(72) Inventors: Ming Qiao, Chengdu (CN); Yue Gao, Chengdu (CN); Jiawei Wang, Chengdu (CN); Dingxiang Ma, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 409 days.

(21) Appl. No.: 18/382,561

(22) Filed: Oct. 23, 2023

(65) Prior Publication Data

US 2024/0395930 A1 Nov. 28, 2024

(30) Foreign Application Priority Data

May 24, 2023 (CN) .......................... 202310591908.3

(51) Int. Cl.
| | |
|---|---|
| *H10D 30/65* | (2025.01) |
| *H10D 30/60* | (2025.01) |
| *H10D 62/17* | (2025.01) |
| *H10D 64/27* | (2025.01) |

(52) U.S. Cl.
CPC ........... *H10D 30/65* (2025.01); *H10D 30/611* (2025.01); *H10D 62/393* (2025.01); *H10D 64/518* (2025.01)

(58) Field of Classification Search
CPC .... H10D 30/65; H10D 30/611; H10D 64/518; H10D 62/393
USPC .......................................................... 257/339
See application file for complete search history.

(56) References Cited

U.S. PATENT DOCUMENTS

| | | | | |
|---|---|---|---|---|
| 11,424,331 | B1 * | 8/2022 | Qiao ...................... | H10D 64/01 |
| 2009/0283825 | A1 * | 11/2009 | Wang ................... | H10D 64/027 |
| | | | | 257/E29.256 |
| 2014/0346597 | A1 * | 11/2014 | Feilchenfeld ...... | H10D 30/0281 |
| | | | | 438/286 |
| 2021/0159333 | A1 * | 5/2021 | Lee ...................... | H10D 30/603 |
| 2023/0335636 | A1 * | 10/2023 | Shi ....................... | H10D 62/393 |
| 2023/0343869 | A1 * | 10/2023 | Xu ...................... | H10D 30/0285 |

* cited by examiner

*Primary Examiner* — Igwe U Anya
(74) *Attorney, Agent, or Firm* — Bayramoglu Law Offices LLC

(57) ABSTRACT

A lateral power semiconductor device is provided and includes a second doping type substrate, a first doping type buried layer, a second doping type epitaxial layer, a first doping type drift area, a second doping type first body area, a first doping type drain area, a first doping type source area, a second doping type second body area, a dielectric layer, a control gate, a body electrode, second doping type polysilicon and first doping type polysilicon. The control gate is led out and connected to different potentials; when the device is in an off state, the control gate is connected to a low potential to assist the drift area in depletion; and when the device is in an on state, the control gate is connected to a high potential, and more carriers are induced on a silicon surface below the control gate.

9 Claims, 10 Drawing Sheets

LATERAL POWER SEMICONDUCTOR DEVICE

CROSS REFERENCE TO THE RELATED APPLICATIONS

This application is based upon and claims priority to Chinese Patent Application No. 202310591908.3, filed on May 24, 2023, the entire contents of which are incorporated herein by reference.

TECHNICAL FIELD

The present invention belongs to the technical field of power semiconductors, and relates to a lateral power semiconductor device.

BACKGROUND

In the field of power integrated circuits, power semiconductor devices are widely applied. In particular, in the field of integrated drive circuits, a laterally-diffused metal-oxide semiconductor (LDMOS) plays an indispensable role due to the characteristic of easy integration. A reduce surface field (RESURF) is often used to improve the electrical characteristics of LDMOS. The power LDMOS usually requires low specific on resistance ($R_{on,sp}$), large safe operating area (SOA) and high breakdown voltage. The schematic diagram of a traditional LDMOS device is shown in FIG. 1, and a metal field plate is connected to a source electrode. A high-current device usually has large switching loss, which will affect the performance and life of the device.

SUMMARY

To reduce a switching loss and obtain a high-current low-resistance device, a lateral power semiconductor device with a double gate structure is introduced. As shown in FIG. 2A, the voltage of a control gate when the device is switched off may be separately set, and a negative potential is given to the control gate to make the control gate assist a drift area in depletion, which is conducive to obtaining an expected breakdown voltage at a higher drift area concentration, thereby increasing the on current, reducing $R_{on,sp}$, and not reducing the breakdown voltage of the device. However, to avoid hot-carrier effect and advanced breakdown caused by excessively strong electric field modulation effect of the control gate on a silicon surface, the thickness of an insulating dielectric layer under SAB is adjusted to make the dielectric layer close to a drain area thicker, so that the advanced breakdown problem of the device can be effectively relieved, where SAB is salicide block. On the control gate, polysilicon with a PN junction is used, thereby reducing the gate-drain coupling charge number and the equivalent capacitance $C_{GD}$.

Based on the above theoretical analysis, the double gate structure and different dielectric layers introduced by the present invention can adjust the voltage of the control gate to reduce the loss and the specific on resistance of the device, optimize the breakdown voltage of the device and relieve the hot-carrier injection effect. The present invention appears under this background.

To achieve the aforementioned objective of the present invention, the technical solution of the present invention is as follows:

a lateral power semiconductor device includes: a second doping type substrate 1, a first doping type buried layer 2 above the second doping type substrate 1, a second doping type epitaxial layer 3 above the first doping type buried layer 2, a first doping type drift area 4 above an interior of the second doping type epitaxial layer 3, a left-side second doping type first body area 5 and a right-side first doping type drain area 8 inside the first doping type drift area 4, and a first doping type source area 7 and a second doping type second body area 6 on an inner upper surface of the second doping type first body area 5, where the first doping type source area 7 is adjacent to and short-connected to the second doping type second body area 6; a dielectric layer 13 is arranged on an upper surface of the first doping type drift area 4;

a source electrode 9, a main gate 10, a salicide block (SAB) structure 11, a control gate 14 and a drain electrode 12 are arranged inside the dielectric layer 13 from left to right, the source electrode 9 is in ohmic contact with the first doping type source area 7, and the source electrode 9 is in ohmic contact with the second doping type second body area 6; the main gate 10 is located above the second doping type first body area 5 and the first doping type drift area 4, and is isolated from semiconductor silicon through the dielectric layer 13; the control gate 14 is located above the salicide block (SAB) structure 11, the salicide block (SAB) structure 11 is located above the first doping type drift area 4, and the salicide block (SAB) structure 11 is isolated from a surface of the first doping type drift area 4 through the dielectric layer 13; and the drain electrode 12 is in ohmic contact with the first doping type drain area 8.

As a preferred manner, the width of the main gate 10 is greater than the length of the channel, so that an accumulation area is formed on the surface of the first doping type drift area 4. The on resistance is reduced, the static characteristic is improved, and the loss of the device is reduced.

In a traditional structure, the control gate is deposited on the salicide block (SAB) structure 11 and connected to the source electrode 9, and has the same fixed potential, thereby increasing the breakdown voltage of the device. The present invention provides a lateral power semiconductor device having a double gate structure. The control gate 14 is separately led out and connected to different potentials, and the main gate 10 is connected to a low potential. When the device is switched off, a negative voltage is provided to the control gate 14 to assist the first doping type drift area 4 below the control gate in depletion. Therefore, the first doping type drift area 4 with higher concentration may be used to reduce $R_{on,sp}$ and increase the saturation current without reducing the breakdown voltage.

As a preferred manner, the lateral power semiconductor device includes a double gate structure with the control gate 14 and the main gate 10, where the control gate 14 structure is led out and separately connected to a potential, and when the device is in an off state, the main gate 10 is connected to a low potential, the source electrode 9 is connected to the low potential or is grounded, the drain electrode 12 is connected to a high potential, and the control gate 14 provides the low potential.

As a preferred manner, when the device is in an on state, the main gate 10 is connected to a high potential, the source electrode 9 is connected to a low potential or is grounded, the drain electrode 12 is connected to a high potential, the control gate 14 is connected to the high potential, and the high potential is in a positive voltage. More carriers are induced on a silicon surface below the control gate, thereby further increasing the saturation current of the device, and reducing the loss and R$_{on,sp}$ of the device.

As a preferred manner, before the main gate 10 is connected to a low potential and the device is switched off, a signal of the control gate 14 is connected to the low potential in advance.

Specifically, the low potential of the signal of the control gate 14 is ahead of a switch-off signal of the main gate, so it is beneficial to reduce the current when the device is switched off, reduce the loss and increase the switch-off speed. The additionally introduced electrical signal of the control gate 14 can increase the switching speed of the device, reduce the switching loss of the device, and optimize the static and dynamic characteristics of the device.

As a preferred manner, when the device is switched on, the main gate 10 is connected to a high potential, the source electrode 9 is connected to a low potential or is grounded, the drain electrode 12 is connected to a high potential, and an electrode of the control gate 14 is connected to the high potential; before the main gate 10 is connected to the low potential and the device is switched off, a signal of the control gate 14 is connected to the low potential in advance; and when the device is switched off, the main gate 10 is connected to the low potential, and a signal of the control gate 14 is connected to the low potential.

Specifically, in the proposed device structure, when the potential of the main gate 10 is a high potential and the device is switched on, a positive voltage is provided to the control gate 14; before the gate voltage is converted from a high potential to a low potential, a negative voltage is provided to the control gate 14, so that the current when the device is switched off is reduced; and when the device is switched off, the control gate 14 provides a negative voltage to assist the drift area in depletion. Therefore, the concentration of the drift area can be increased to reduce R$_{on,sp}$ without the breakdown voltage is not changed, increase the saturation current, increase the switching speed of the device and reduce the loss.

The additionally introduced electrical signal of the control gate 14 is used to increase the switching speed of the device, reduce the switching loss of the device and optimize the static and dynamic characteristics of the device, thereby obtaining a lateral power semiconductor device with the characteristics of high current and low loss.

As a preferred manner, a body electrode 15 is arranged on a left side of the source electrode 9, the source electrode 9 and the body electrode 15 are separately connected to potentials, and the source electrode 9 can be connected to different potentials to sample current signals, thereby achieving different waveform control.

As a preferred manner, the dielectric layer below the salicide block (SAB) structure 11 and the control gate 14 is in a stepped shape, and the dielectric layer close to a drain terminal is thicker. The modulation effect of the control gate 14 can be reduced, so that the hot-carrier injection effect can be reduced, and the advanced breakdown of the device can be avoided, thereby achieving high current, low R$_{on,sp}$ and good static characteristic without reducing the breakdown voltage. The structure characteristic is to introduce insulating layers with different thicknesses to reach an expected breakdown voltage. The dielectric layer may be made into multiple steps, and can better regulate and control the electric field distribution of the silicon surface compared with a single step.

As a preferred manner, the dielectric layer below the salicide block (SAB) structure 11 and the control gate 14 is in slope shape, and the dielectric layer is thickened uniformly in a direction from a source terminal to a drain terminal. Therefore, the modulation effect of the control gate on the silicon surface is reduced linearly with the decrease of a distance from the drain area, and the curvature effect introduced by the stepped structure can be avoided.

As a preferred manner, no metal is deposited on the salicide block (SAB) structure 11, but second doping type polysilicon 22 and first doping type polysilicon 23 are deposited on the salicide block (SAB) structure; the second doping type polysilicon 22 and the first doping type polysilicon 23 form the control gate 14; and in a case that a negative bias voltage is applied to the control gate, a PN junction in the control gate is in a reverse bias depletion state and has a large depletion capacitance. The introduction of the capacitance makes the capacitance of the dielectric layer and the gate-drain capacitance converted from a parallel connection relationship to a series connection relationship, thereby reducing the coupling capacitance, increasing the switching speed of the device, reducing the loss of the device, and optimizing the static and dynamic characteristics of the device.

The present invention has the following beneficial effects: the present invention provides a lateral power semiconductor device with a control gate besides a main gate. Compared with the traditional LDMOS, the device can reduce the loss of the power device, increase the on current, and reduce the R$_{on,sp}$ and capacitance of the device. The carrier distribution is changed by adjusting the waveform of the signal of the control gate, so that the electric field distribution is adjusted to reach an expected breakthrough voltage, and R$_{on,sp}$ is reduced to obtain a high-current device. The thickness of the insulating layer is adjusted under the SAB structure, so that the hot-carrier injection effect close to the drain electrode is reduced, and the breakthrough voltage is effectively increased. A polysilicon electrode is introduced on the SAB structure of the LDMOS device, thereby reducing the gate-drain capacitance and the loss of the device.

Figure 1:
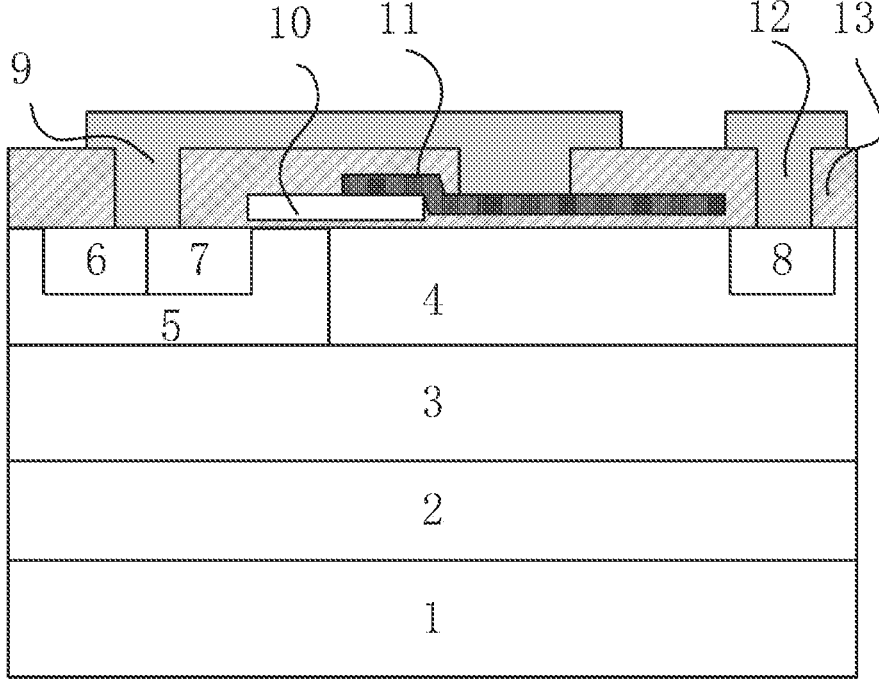
FIG. 1 is a schematic structural diagram of a traditional lateral power semiconductor device.

1: second doping type substrate; 2: first doping type buried layer; 3: second doping type epitaxial layer; 4: first doping type drift area, 5: second doping type first body area; 6: second doping type second body area; 7: first doping type source area; 8: first doping type drain area; 9: source electrode; 10: main gate; 11: salicide block (SAB) structure; 12: drain electrode; 13: dielectric layer; 14: control gate; 15: body electrode; 22: second doping type polysilicon; 23: first doping type polysilicon.

DETAILED DESCRIPTION OF THE EMBODIMENTS

The implementation manners of the present invention are described below by the specific embodiments. Those skilled in the art may easily understand other advantages and effects of the present invention by the contents disclosed by the specification. The present invention can be implemented or applied through other different specific implementation manners. Various modifications or changes can be made to various details in the specification based on different viewpoints and applications without departing from the spirit of the present invention.

The following specific implementation structure, in particular, a method for introducing a control gate to optimize a static parameter, is not only suitable for LDMOS, but also suitable for IGBT devices, or power integrated semiconductor devices by means of a RESURF technology and a super junction (SJ) technology.

In the following embodiments:

a source electrode 9, a drain electrode 12 and a body electrode 15 are made of metal.

A main gate 10 is made of polysilicon.

A salicide block (SAB) structure 11 is made of silicon rich oxide (SRO), $SiO_2$, SiON or $Si_3N_4$.

A dielectric layer 13 is made of silicon dioxide.

A control gate 14 is made of metal.

A first doping type is N-type doping, and a second doping type is P-type doping.

Embodiment 1

Figure 2A:
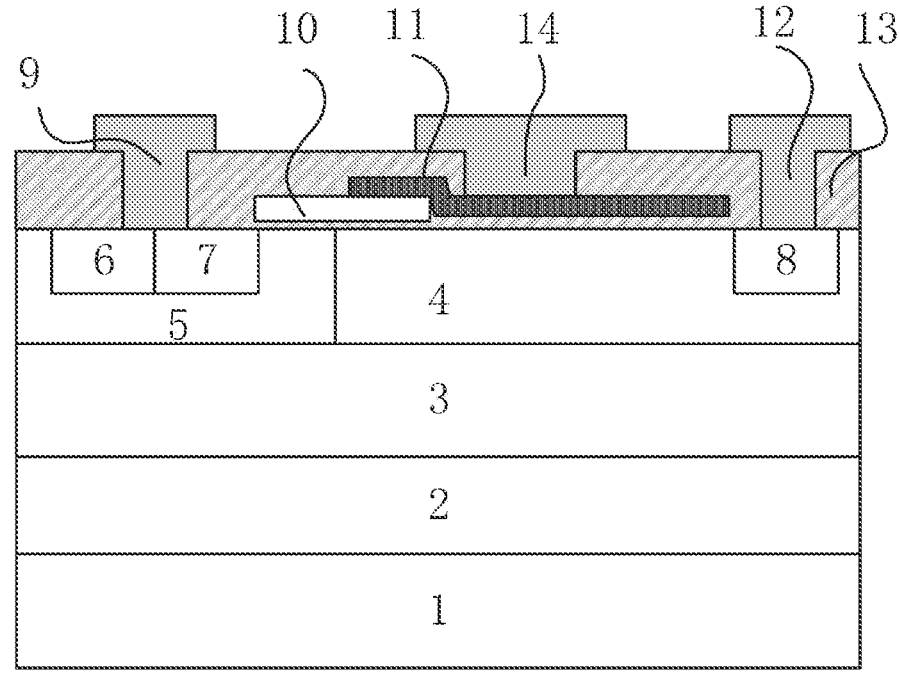
FIG. 2A is a schematic structural diagram of a lateral power semiconductor device according to Embodiment 1 of the present invention.

As shown in FIG. 2A, a lateral power semiconductor device includes: a second doping type substrate 1, a first doping type buried layer 2 above the second doping type substrate 1, a second doping type epitaxial layer 3 above the first doping type buried layer 2, a first doping type drift area 4 above an interior of the second doping type epitaxial layer 3, a left-side second doping type first body area 5 and a right-side first doping type drain area 8 inside the first doping type drift area 4, and a first doping type source area 7 and a second doping type second body area 6 on an inner upper surface of the second doping type first body area 5, where the first doping type source area 7 is adjacent to and short-connected to the second doping type second body area 6; a dielectric layer 13 is arranged on an upper surface of the first doping type drift area 4;

a source electrode 9, a main gate 10, a salicide block (SAB) structure 11, a control gate 14 and a drain electrode 12 are arranged inside the dielectric layer 13 from left to right; the source electrode 9 is in ohmic contact with the first doping type source area 7, and the source electrode 9 is in ohmic contact with the second doping type second body area 6; the main gate 10 is located above the second doping type first body area 5 and the first doping type drift area 4, and they are isolated from a semiconductor silicon through the dielectric layer 13; the control gate 14 is located above the salicide block (SAB) structure 11, the salicide block (SAB) structure 11 is located above the first doping type drift area 4, and the salicide block (SAB) structure 11 is isolated from the surface of the first doping type drift area 4 through the dielectric layer 13; and the drain electrode 12 is in ohmic contact with the first doping type drain area 8.

Figure 2B:
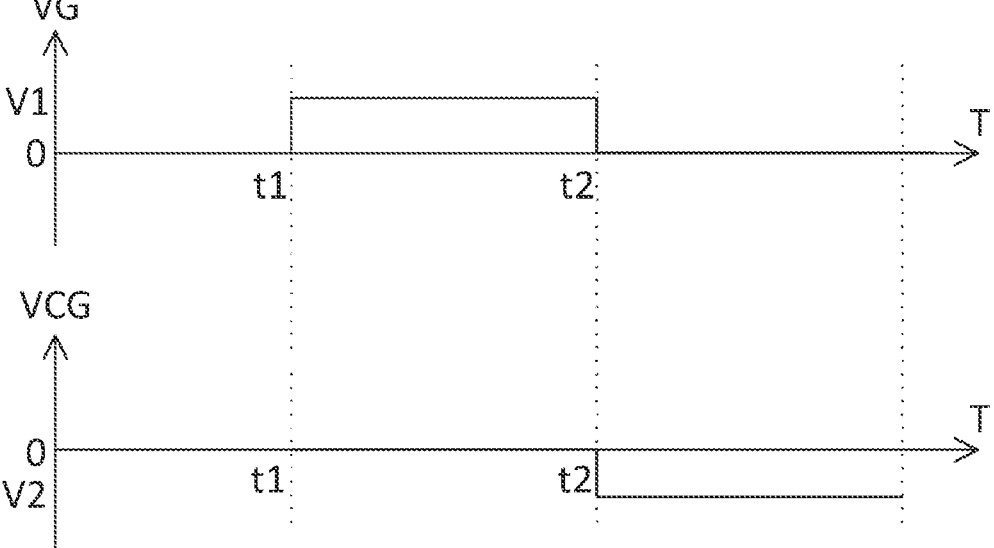
FIG. 2B is a signal oscillogram of a control gate and a main gate according to Embodiment 1 of the present invention.

To improve the static and dynamic characteristics of the device, the present invention introduces a new way to apply voltage, and the voltage waveform of the control gate 14 and the main gate 10 is shown in FIG. 2B. In a case that the main gate 10 is connected to a low potential, the control gate 14 is connected to the low potential which is in a negative voltage.

The working principle of this embodiment is: when the device is in an off state, the main gate 10 is connected to a low potential, the source electrode 9 is connected to the low potential or is grounded, the drain electrode 12 is connected to a high potential, the control gate 14 is connected to the low potential which may be in a negative voltage, electrons are repelled at a silicon surface below the control gate 14, and the first doping type drift area 4 below the control gate are assisted in depletion, so that the breakdown voltage of the device can be improved. Therefore, the device can obtain low $R_{on,sp}$ and a high saturation current by increasing the concentration of the first doping type drift area 4, and the control gate 14 can provide a negative voltage to maintain the breakdown voltage unchanged.

Figure 9:
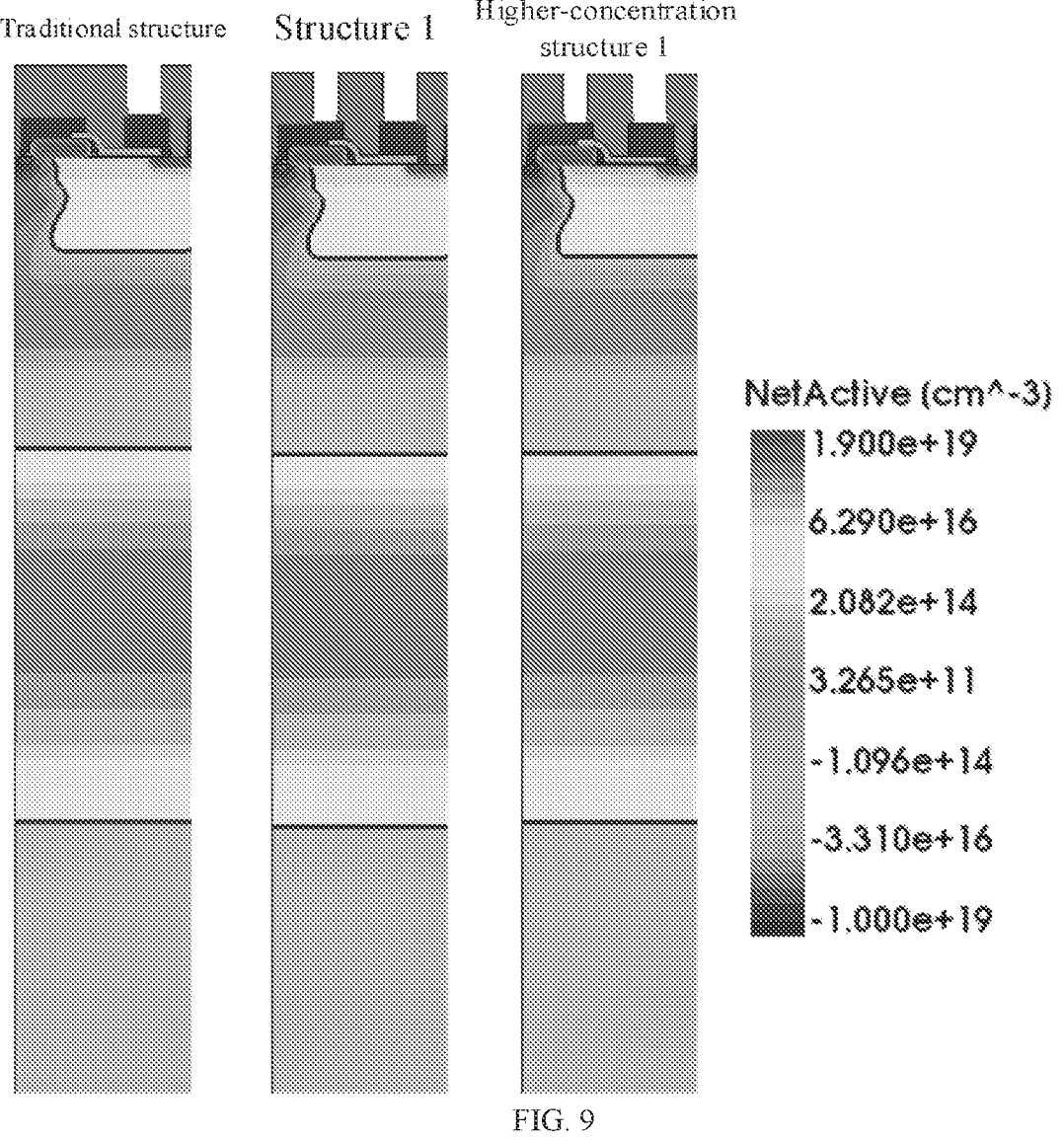
FIG. 9 is a simulation structure diagram of a traditional lateral power semiconductor device and Embodiment 1.

FIG. 9 is a simulation structure diagram of a traditional lateral power semiconductor device and Embodiment 1. In the traditional structure, the control gate 14 is short-connected to the source electrode 9 and is connected to a zero potential, the structure 1 is a lateral power semiconductor device structure provided in Embodiment 1; the control gate 14 and the source electrode 9 are separated and may be separately connected to different potentials, and a higher-concentration structure 1 increases the concentration of the first doping type drift area 4 based on the structure 1.

Figure 10:
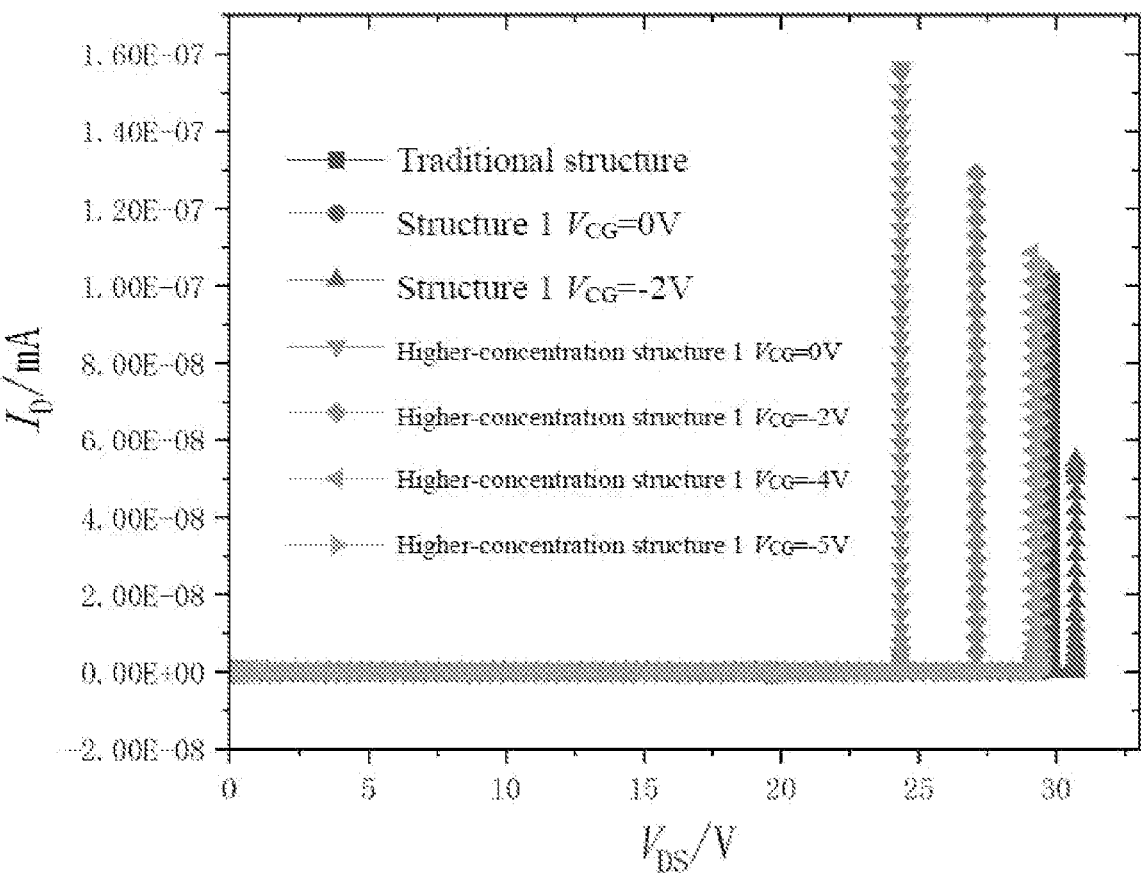
FIG. 10 is a breakdown curve of a traditional lateral power semiconductor device and Embodiment 1 in an off state at different drift area concentrations and control gate voltages.

FIG. 10 is a breakdown curve of a traditional lateral power semiconductor device and Embodiment 1 in an off state at different drift area concentrations and control gate voltages. In FIG. 10, the structure 1 is a lateral power semiconductor device structure provided in Embodiment 1; and a higher-concentration structure 1 increases the concentration of the first doping type drift area 4 based on the structure 1. The traditional structure and the structure 1 have the same concentration of the first doping type drift area 4. The breakdown voltage of the high-concentration drift area is lower than that of the low-concentration drift area. Different negative voltages are applied to the control gate 14, so that the breakdown voltage of the device can remain constant while the concentration of the first doping type drift area 4 and the saturation current are increased.

Figure 11:
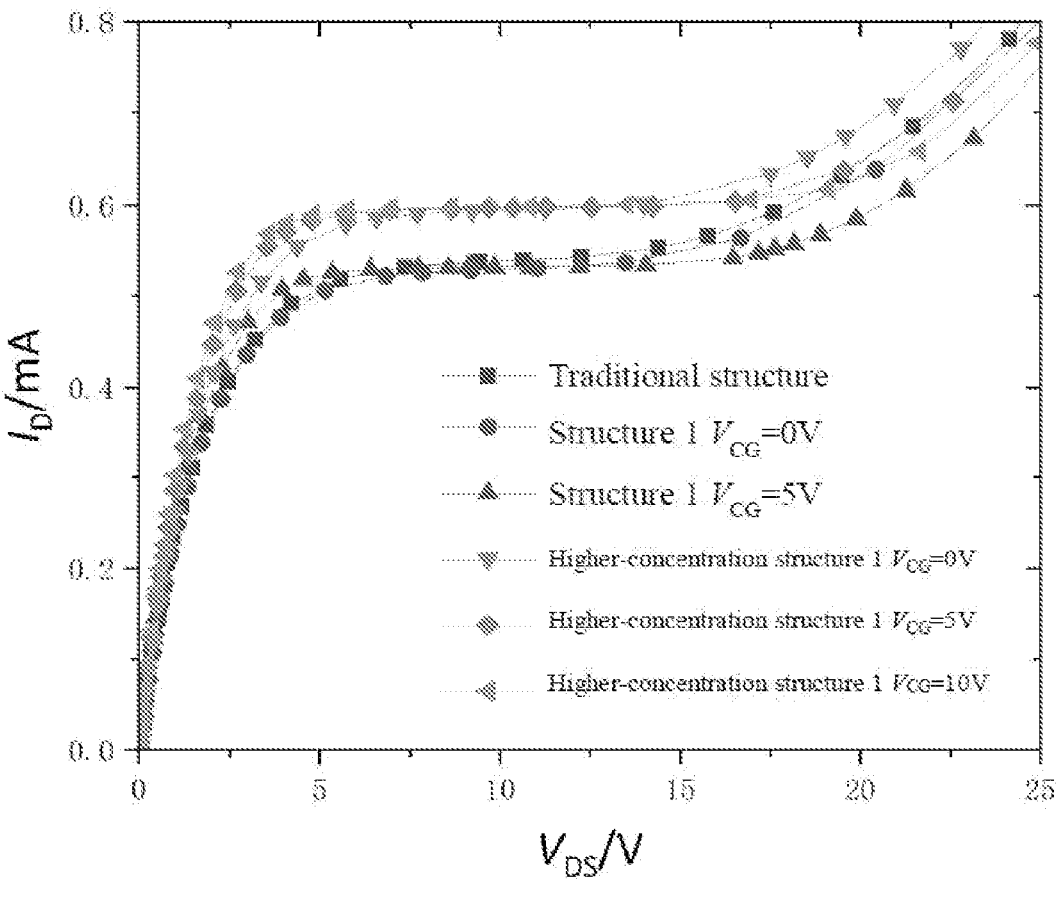
FIG. 11 is an output characteristic curve of a traditional lateral power semiconductor device and Embodiment 1 at different drift area concentrations and control gate voltages.

FIG. 11 is an output characteristic curve of a traditional lateral power semiconductor device and Embodiment 1 at different drift area concentrations and control gate voltages. The structure 1 is a lateral power semiconductor device structure provided in Embodiment 1; and a higher-concentration structure 1 increases the concentration of the first doping type drift area 4 based on the structure 1. It can be seen from the figure that the structure in Embodiment 1 may adopt a higher concentration of the first doping type drift area 4 to increase the saturation current; furthermore, the higher the voltage of the control gate 14, the higher the switch-on speed of the device and the higher the breakdown voltage in an on state.

Figure 12:
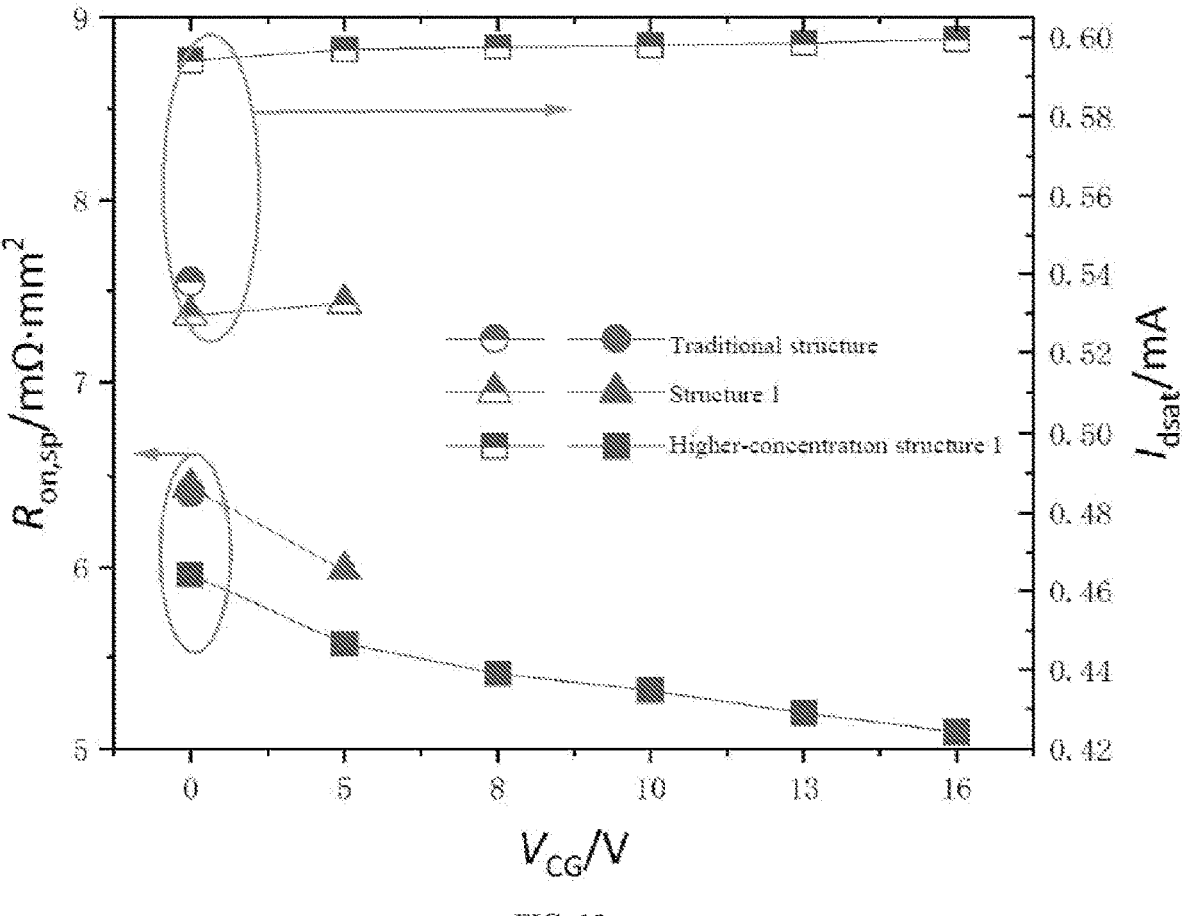
FIG. 12 is a specific on resistance and a saturation current of a traditional lateral power semiconductor device and Embodiment 1 in an off state at different drift area concentrations and control gate voltages.

FIG. 12 is a specific on resistance and a saturation current of a traditional lateral power semiconductor device and Embodiment 1 at different drift area concentrations and control gate voltages. The structure 1 is a lateral power semiconductor device structure provided in Embodiment 1; and a higher-concentration structure 1 increases the concentration of the first doping type drift area 4 based on the structure 1. It can be seen from the figure that the higher the voltage of the control gate 14, the lower the $R_{on,sp}$ and the higher the saturation current.

Embodiment 2

Figure 3A:
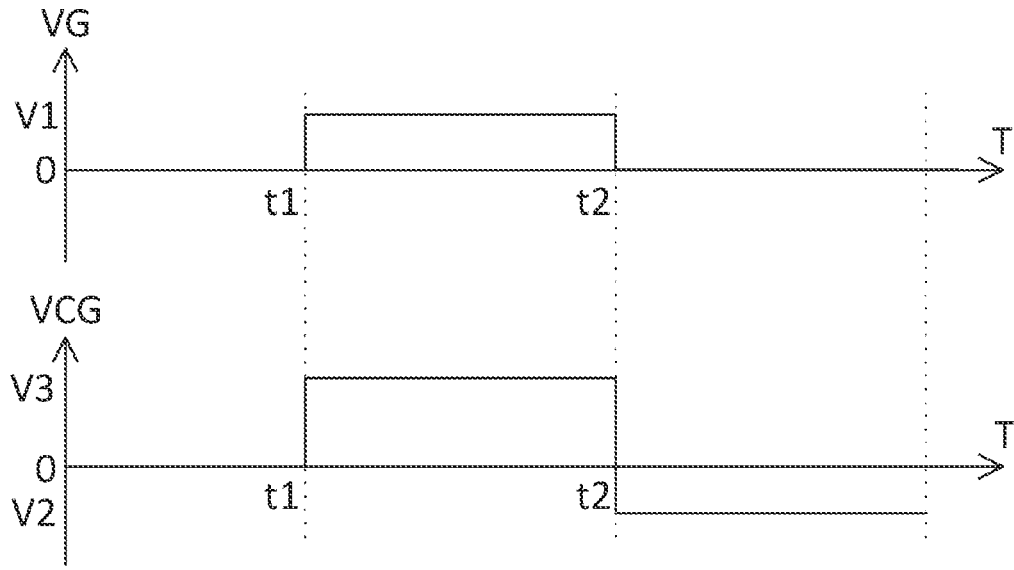
FIG. 3A is a signal oscillogram of a control gate and a main gate according to Embodiment 2 of the present invention.
Figure 3B:
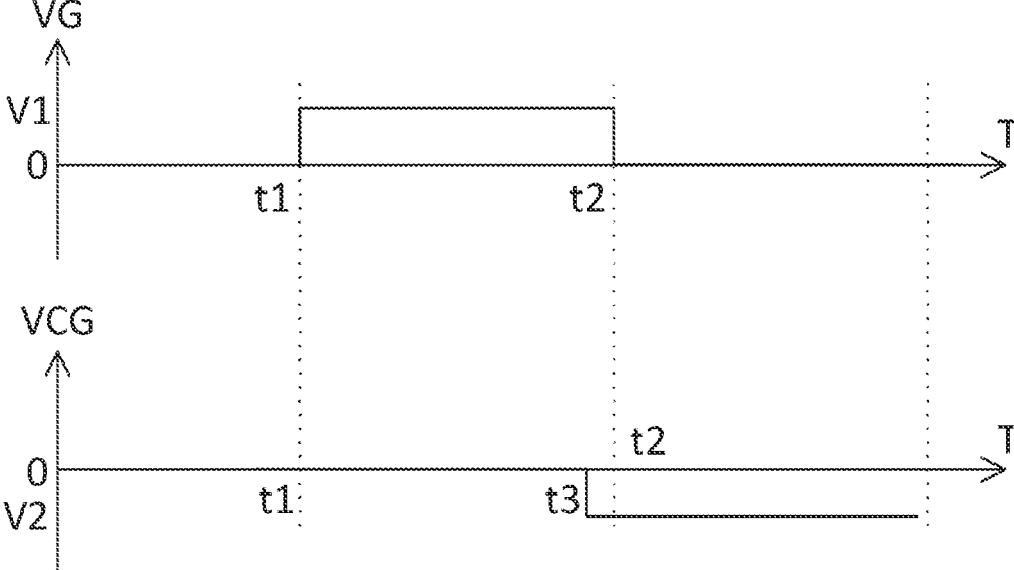
FIG. 3B is a signal oscillogram of a control gate and a main gate according to Embodiment 2 of the present invention.
Figure 3C:
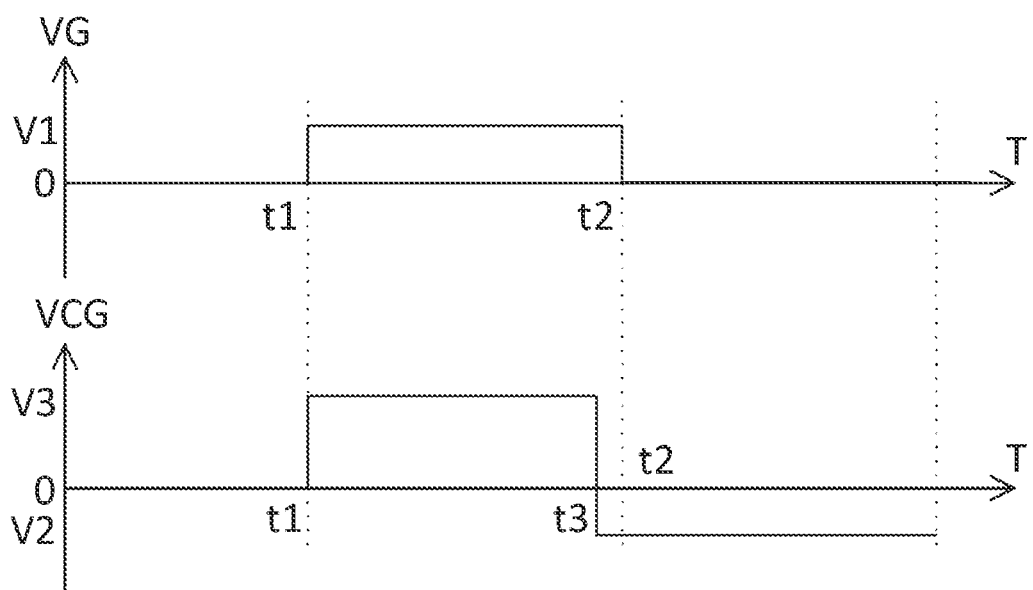
FIG. 3C is a signal oscillogram of a control gate and a main gate according to Embodiment 2 of the present invention.

As shown in FIG. 3A, FIG. 3B and FIG. 3C, the difference between this embodiment and Embodiment 1 is as follows: the control gate 14 and the main gate 10 have different signal waveform.

As shown in FIG. 3A, when the device is in an on state, the main gate 10 is connected to a high potential, the source electrode 9 is connected to a low potential or is grounded, the drain electrode 12 is connected to a high potential, the control gate 14 is connected to the high potential, and the high potential is in a positive voltage Therefore, more electrons are induced on the silicon surface below the control gate 14, the carrier concentration of a conductive path is increased, the saturation current and the switch-on speed of the device are further increased, and $R_{on,sp}$ is reduced.

As shown in FIG. 3B, before the main gate 10 is connected to a low potential and the device is switched off, the control gate 14 is connected to the low potential in advance, so that the on current can be reduced, the switch-off speed of the device can be increased, and the switching loss can be reduced.

As shown in FIG. 3C, when the device is switched on, the main gate 10 is connected to a high potential, the source electrode 9 is connected to a low potential or is grounded, the drain electrode 12 is connected to a high potential, and the control gate 14 is connected to the high potential; before the main gate 10 is connected to the low potential and the device is switched off, the control gate 14 is connected to the low potential in advance; and when the device is switched off, the main gate 10 is connected to the low potential, and the control gate 14 is connected to the low potential. Therefore, a lateral power semiconductor device with the characteristics of high current and low loss can be obtained, and a high negative voltage can be provided to the control gate 14 to ensure that the breakdown voltage of the device is not reduced.

Embodiment 3

Figure 4:
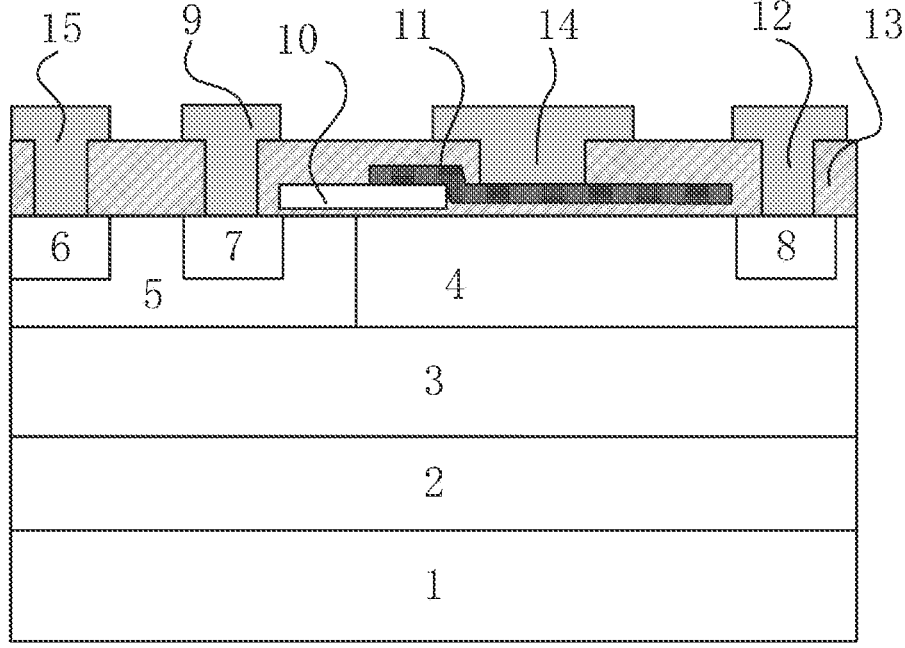
FIG. 4 is a schematic structural diagram of a lateral power semiconductor device according to Embodiment 3 of the present invention.

As shown in FIG. 4, the difference between this embodiment and Embodiment 1 is as follows: a body electrode 15 is arranged on a left side of the source electrode 9, the source electrode 9 and the body electrode 15 are separately connected to potentials, the potential of the source electrode 9 may float, and the source electrode 9 may be connected to different potentials to sample current signals.

Embodiment 4

Figures 5, 6:
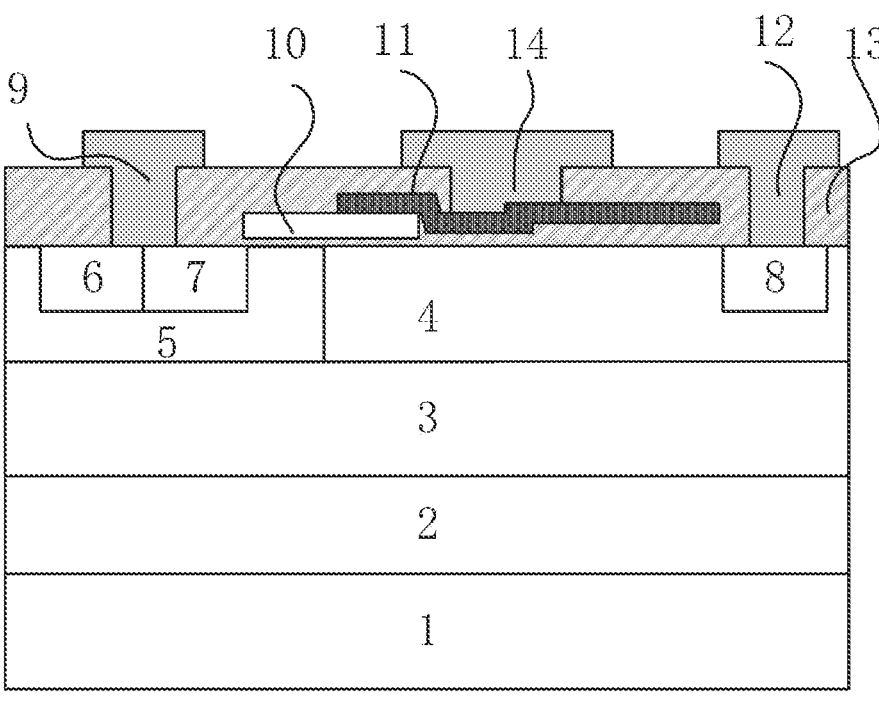
FIG. 5 is a schematic structural diagram of a lateral power semiconductor device according to Embodiment 4 of the present invention.
FIG. 6 is a schematic structural diagram of a lateral power semiconductor device according to Embodiment 5 of the present invention.

As shown in FIG. 5, the difference between this embodiment and Embodiment 1 is as follows: the dielectric layer below the salicide block (SAB) structure 11 and the control gate 14 is in a stepped shape, and the dielectric layer close to a drain terminal is thicker. The electric field modulation effect of the control gate 14 and the hot-carrier injection effect can be reduced, and the advanced breakdown of the device can be avoided, so that the breakdown voltage of the device can be optimized, and good static characteristic can be achieved.

Embodiment 5

As shown in FIG. 6, the difference between this embodiment and Embodiment 4 is as follows: the dielectric layer below the salicide block (SAB) structure 11 and the control gate 14 has a stepped shape including multiple steps. The dielectric layer has more steps and has better electric field modulation effect compared with the single step, thereby avoiding breakdown before reaching the expected voltage.

Embodiment 6

Figure 7:
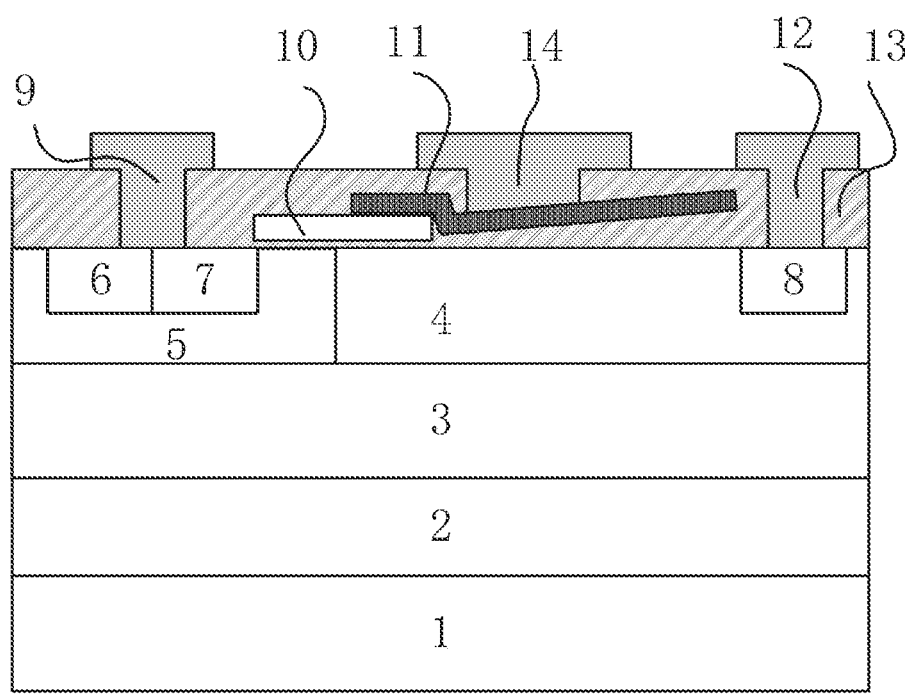
FIG. 7 is a schematic structural diagram of a lateral power semiconductor device according to Embodiment 6 of the present invention.

As shown in FIG. 7, the difference between this embodiment and Embodiment 1 is as follows: the dielectric layer below the salicide block (SAB) structure 11 and the control gate 14 is in a slope shape, and the dielectric layer is thickened uniformly in a direction from a source terminal to a drain terminal. Therefore, the modulation effect of the control gate 14 is reduced uniformly with the decrease of the distance from the drain terminal. Meanwhile, the structure also can reduce the curvature effect at the dielectric layer introduced by Embodiment 4 and Embodiment 5.

Embodiment 7

Figure 8:
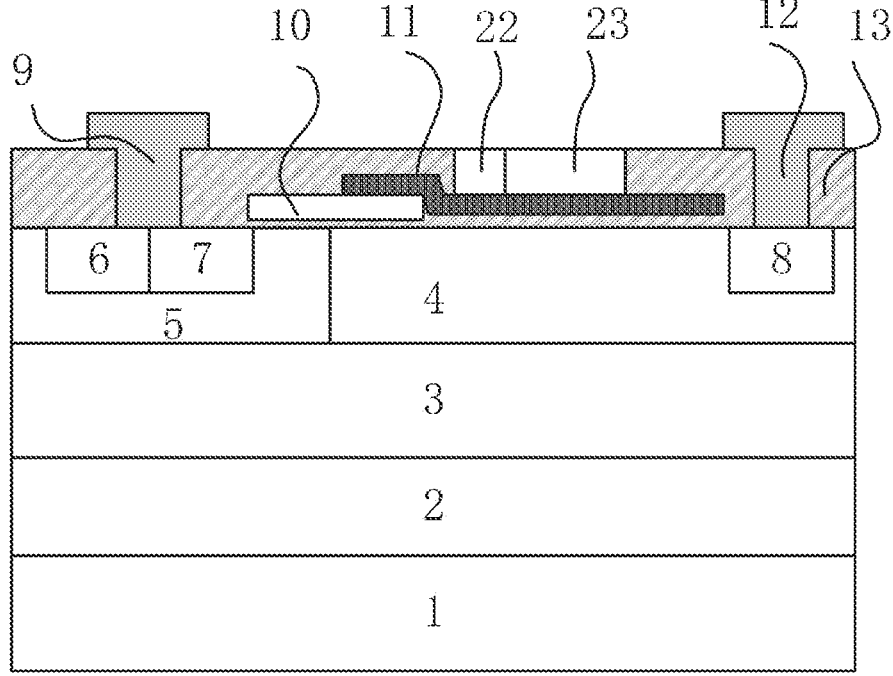
FIG. 8 is a schematic structural diagram of a lateral power semiconductor device according to Embodiment 7 of the present invention.

As shown in FIG. 8, the difference between this embodiment and Embodiment 1 is as follows: no metal is deposited on the salicide block (SAB) structure 11, but second doping type polysilicon 22 and first doping type polysilicon 23 are deposited on the salicide block (SAB) structure 11; the second doping type polysilicon 22 and the first doping type polysilicon 23 form the control gate 14; in a case that a negative bias voltage is applied to the control gate, and PN junction in the control gate is in a reverse bias state.

The control gate is formed by polysilicon with PN junction in a reverse bias depletion state, which has large depletion capacitance. The introduction of the capacitance makes the capacitance of the dielectric layer and the gate-drain capacitance converted from a parallel connection relationship to a series connection relationship, thereby reducing the coupling capacitance, increasing the switching speed of the device, reducing the loss of the device, and optimizing the static and dynamic characteristics of the device.

In particular, the structures in the specification may be combined with each other, and parameters can be adjusted according to the actual process conditions to achieved the optimal characteristics of the device. In addition, the first doping type drain area 8 in each embodiment is changed into a second doping type semiconductor, and an LIGBT structure can be formed.

The above embodiments are only intended to exemplarily illustrate the principle and effect of the present invention, but not intended to limit the present invention. Any person skilled in the art can modify or change the above embodiments without departing from the spirit and scope of the present invention. Therefore, all equivalent modifications or changes made by those with ordinary knowledge in the art without departing the spirit and technical ideal disclosed by the present invention should still be covered within the claims of the present invention.

What is claimed is:

1. A lateral power semiconductor device, comprising:
a second doping type substrate, a first doping type buried layer above the second doping type substrate, a second doping type epitaxial layer above the first doping type buried layer, a first doping type drift area above an interior of the second doping type epitaxial layer, a left-side second doping type first body area and a right-side first doping type drain area inside the first doping type drift area, and a first doping type source area and a second doping type second body area on an inner upper surface of the second doping type first body area, wherein
the first doping type source area is adjacent to and short-connected to the second doping type second body area; a dielectric layer is arranged on an upper surface of the first doping type drift area;
a source electrode, a main gate, a salicide block (SAB) structure, a control gate and a drain electrode are arranged inside the dielectric layer from left to right;
the source electrode is in ohmic contact with the first doping type source area and the second doping type second body area;
the main gate is located above the second doping type first body area and the first doping type drift area, and is isolated from a semiconductor silicon through the dielectric layer;
the control gate is located above the SAB structure, the SAB structure is located above the first doping type drift area, and the SAB structure is isolated from a surface of the first doping type drift area through the dielectric layer; and
the drain electrode is in ohmic contact with the first doping type drain area,
wherein a width of the main gate is greater than a length of a channel, wherein an accumulation area is formed on the surface of the first doping type drift area.

2. The lateral power semiconductor device according to claim 1, comprising a double gate structure with the control gate and the main gate, wherein a control gate structure is led out and separately connected to a potential; and
when the lateral power semiconductor device is in an off state, the main gate is connected to a low potential, the source electrode is connected to the low potential or is grounded, the drain electrode is connected to a high potential, and the control gate provides the low potential.

3. The lateral power semiconductor device according to claim 1, wherein when the lateral power semiconductor device is in an on state, the main gate is connected to a high potential, the source electrode is connected to a low potential or is grounded, the drain electrode is connected to the high potential, the control gate is connected to the high potential, and the high potential is in a positive voltage.

4. The lateral power semiconductor device according to claim 1, wherein before the main gate is connected to a low potential and the lateral power semiconductor device is switched off, the control gate is connected to the low potential in advance.

5. The lateral power semiconductor device according to claim 1, wherein when the lateral power semiconductor device is switched on, the main gate is connected to a high potential, the source electrode is connected to a low potential or is grounded, the drain electrode is connected to the high potential, and an electrode of the control gate is connected to the high potential;
before the main gate is connected to the low potential and the lateral power semiconductor device is switched off, the control gate is connected to the low potential in advance; and
when the lateral power semiconductor device is switched off, the main gate is connected to the low potential, and the control gate is connected to the low potential.

6. The lateral power semiconductor device according to claim 1, wherein a body electrode is arranged on a left side of the source electrode, the source electrode and the body electrode are separate, and the source electrode is connected to different potentials to sample current signals.

7. The lateral power semiconductor device according to claim 1, wherein the dielectric layer below the SAB structure and the control gate is in a stepped shape, and the dielectric layer adjacent to a drain terminal is thicker.

8. The lateral power semiconductor device according to claim 1, wherein the dielectric layer below the SAB structure and the control gate is in a slope shape, and the dielectric layer is thickened uniformly in a direction from a source terminal to a drain terminal.

9. The lateral power semiconductor device according to claim 1, wherein no metal is deposited on the SAB structure, but a second doping type polysilicon and a first doping type polysilicon are deposited on the SAB structure;
the second doping type polysilicon and the first doping type polysilicon form the control gate; and
in a case that a negative bias voltage is applied to the control gate, a PN junction on the control gate is in a reverse bias state.

* * * * *